US008913391B2

(12) United States Patent
Ling et al.

(10) Patent No.: US 8,913,391 B2
(45) Date of Patent: Dec. 16, 2014

(54) BOARD-LEVEL HEAT TRANSFER APPARATUS FOR COMMUNICATION PLATFORMS

(75) Inventors: Wei Ling, Randolph, NJ (US); Salvatore Messana, Morris Plains, NJ (US); Paul Rominski, Morris Plains, NJ (US)

(73) Assignee: Alcatel Lucent, Boulogne-Billancourt (FR)

( * ) Notice: Subject to any disclaimer, the term of this patent is extended or adjusted under 35 U.S.C. 154(b) by 212 days.

(21) Appl. No.: 13/360,997

(22) Filed: Jan. 30, 2012

(65) Prior Publication Data
US 2013/0194755 A1 Aug. 1, 2013

(51) Int. Cl.
H05K 7/20 (2006.01)

(52) U.S. Cl.
USPC ...... 361/721; 361/719; 361/700; 361/679.54; 361/702; 361/679.53; 165/185; 257/276

(58) Field of Classification Search
USPC ............... 361/721, 722, 719, 679.54, 679.52, 361/702, 700; 165/185; 257/706
See application file for complete search history.

(56) References Cited

U.S. PATENT DOCUMENTS

| | | | |
|---|---|---|---|
| 5,036,428 A * | 7/1991 | Brownhill et al. | 361/721 |
| 6,310,775 B1 * | 10/2001 | Nagatomo et al. | 361/707 |
| 6,828,675 B2 * | 12/2004 | Memory et al. | 257/714 |
| 7,184,269 B2 * | 2/2007 | Campbell et al. | 361/700 |
| 7,394,654 B2 * | 7/2008 | Zieman et al. | 361/695 |
| 7,639,498 B2 * | 12/2009 | Campbell et al. | 361/699 |
| 7,724,530 B2 * | 5/2010 | Clayton et al. | 361/749 |
| 7,791,881 B2 * | 9/2010 | Chou et al. | 361/695 |
| 7,796,399 B2 * | 9/2010 | Clayton et al. | 361/764 |
| 7,903,409 B2 * | 3/2011 | Patel et al. | 361/700 |
| 7,905,105 B2 * | 3/2011 | Fair et al. | 62/259.2 |
| 7,929,310 B2 * | 4/2011 | Belady et al. | 361/735 |
| 7,933,120 B2 * | 4/2011 | Tanaka et al. | 361/679.5 |
| 8,009,419 B2 * | 8/2011 | Attlesey et al. | 361/679.53 |

(Continued)

FOREIGN PATENT DOCUMENTS

| | | | |
|---|---|---|---|
| JP | 07-032218 B2 | 4/1995 |
| JP | 07-060955 B2 | 6/1995 |

(Continued)

OTHER PUBLICATIONS

Machine Translation of Korean Application No. 1020100052436 generated on Apr. 23, 2014, previously cited on Sep. 26, 2013 and considered on Nov. 27, 2013.

*Primary Examiner* — David M Sinclair
*Assistant Examiner* — Robert Brown
(74) *Attorney, Agent, or Firm* — Hitt Gaines, PC

(57) ABSTRACT

An apparatus, comprising a rack and a cooler. The apparatus also comprises a plurality of electronic circuit boards located in corresponding slots of the rack, each of the electronic circuit boards being held against a portion of the cooler by a corresponding force, some of the electronic circuit boards having a localized heat source thereon The apparatus also comprises a plurality of heat spreaders, each heat spreader configured to form a heat conducting path over and adjacent to one of the electronic circuit boards from one or more of the localized heat sources thereon to the portion of the cooler. The apparatus also comprises a plurality of compliant thermal interface pads, each of the pads being compressed between end of one of the heat spreaders and the portion of the cooler to form a heat conduction path therebetween.

20 Claims, 4 Drawing Sheets

(56) References Cited

U.S. PATENT DOCUMENTS

| | | | |
|---|---|---|---|
| 8,238,094 B1* | 8/2012 | Aybay et al. | 361/679.5 |
| 8,238,104 B2* | 8/2012 | Salpeter | 361/716 |
| 8,385,069 B2* | 2/2013 | Iyengar et al. | 361/700 |
| 8,443,874 B2* | 5/2013 | Mikami | 165/276 |
| 8,570,749 B2* | 10/2013 | Tissot | 361/720 |
| 2003/0218867 A1* | 11/2003 | Sawyer et al. | 361/721 |
| 2004/0136164 A1* | 7/2004 | Morris | 361/721 |
| 2005/0012123 A1* | 1/2005 | Adachi | 257/276 |
| 2006/0067069 A1* | 3/2006 | Heard et al. | 361/796 |
| 2006/0146496 A1* | 7/2006 | Asfia et al. | 361/700 |
| 2006/0221578 A1* | 10/2006 | Foster et al. | 361/721 |
| 2007/0201212 A1* | 8/2007 | Foster et al. | 361/721 |
| 2007/0223199 A1* | 9/2007 | Fujiya et al. | 361/721 |
| 2008/0084668 A1* | 4/2008 | Campbell et al. | 361/702 |
| 2008/0123300 A1* | 5/2008 | Tian et al. | 361/721 |
| 2008/0158819 A1* | 7/2008 | Khanna et al. | 361/702 |
| 2008/0298021 A1* | 12/2008 | Ali et al. | 361/705 |
| 2011/0286175 A1* | 11/2011 | Iyengar et al. | 361/679.47 |
| 2011/0286179 A1* | 11/2011 | Motschman et al. | 361/679.54 |
| 2012/0057297 A1* | 3/2012 | Merz et al. | 361/679.48 |
| 2012/0281359 A1* | 11/2012 | Arney et al. | 361/701 |
| 2013/0077232 A1* | 3/2013 | Nordin et al. | 361/679.47 |

FOREIGN PATENT DOCUMENTS

| | | |
|---|---|---|
| JP | 07-221479 A | 8/1995 |
| JP | 2006-258392 A | 10/2008 |
| KR | 10-0998213 B1 | 12/2010 |

\* cited by examiner

BOARD-LEVEL HEAT TRANSFER APPARATUS FOR COMMUNICATION PLATFORMS

TECHNICAL FIELD

The present invention is directed, in general, to a cooling apparatus and methods for operating and manufacturing the same.

BACKGROUND

This section introduces aspects that may be helpful to facilitating a better understanding of the inventions. Accordingly, the statements of this section are to be read in this light and are not to be understood as admissions about what is in the prior art or what is not in the prior art.

Presently, cooling is known to make a substantial contribution to the operating cost of electronic and/or optical systems that are located in telecom central offices. In addition, such central offices are typically crowded so that the availability of space for devices and cooling equipment is limited.

SUMMARY

One embodiment includes an apparatus, comprising a rack and a cooler. The apparatus also comprises a plurality of electronic circuit boards located in corresponding slots of the rack, each of the electronic circuit boards being held against a portion of the cooler by a corresponding force, some of the electronic circuit boards having a localized heat source thereon The apparatus also comprises a plurality of heat spreaders, each heat spreader configured to form a heat conducting path over and adjacent to one of the electronic circuit boards from one or more of the localized heat sources thereon to the portion of the cooler. The apparatus also comprises a plurality of compliant thermal interface pads, each of the pads being compressed between end of one of the heat spreaders and the portion of the cooler to form a heat conduction path therebetween.

In some embodiments of the apparatus, one or more of the compliant thermal interface pads has a thermal conductivity of at least 1 W/m-K. In some embodiments, at least one of the compliant thermal interface pads is an elastic thermal interface pad. In some embodiments, a thickness of the elastic thermal interface pad is compressible by at least about 10 percent when subjected to the force on the corresponding one of the boards and the thickness returns substantially back to its pre-compression value when the force on the corresponding one of the boards is not applied to the elastic thermal interface pad. In some embodiments, one or more of the compliant thermal interface pads are configured to be fixed to one or both of the heat spreader or the common cooler. In some embodiments, one or more of the compliant thermal interface pads have an electrically insulating outer surface. In some embodiments, one or more of the compliant thermal interface pads have a substantially planar surface that is configured to interface with a planer surface of the heat spreader and with a planar surface of the common cooler. In some embodiments, each force is created by a spring-loaded or leaver-actuated latch applied to a faceplate of the corresponding one of the electronic circuit boards. In some embodiments, the electronic circuit boards fit into single slot of less than about 25 mm in width. In some embodiments, some of the circuit boards swappable out of the rack without interrupting electrical power provided to the other ones of the plurality of circuit boards. In some embodiments, heat spreader is mechanically attached to one of the localized heat sources. In some embodiments, a portion of the heat spreader facing the portion of the cooler is a planar surface that is parallel to a planar surface of the portion of the cooler. In some embodiments, the cooler is configured as an evaporator having a two-phase cooling loop. In some embodiments, the portion of the cooler is positioned in a space between the circuit boards and an electronic backplane of the rack. In some embodiments, the cooler is configured to circulate a refrigerant that is a gas at an ambient temperature and pressure. Some embodiments further include an air-flow device located in the rack and configured to remove heat from the circuit boards.

Another embodiment is a method assembling an apparatus. The method comprises installing a plurality of electronic circuit boards in slots of a rack such that each of the installed electronic circuit boards is held against a portion of a cooler for the rack by a corresponding force. Some of the installed electronic circuit boards have localized heat sources thereon and having heat spreaders configured to form heat conducting paths from the localized heat sources to the cooler. The installing includes causes a compliant thermal interface pad to be compressed between an end of each of the heat spreaders and the cooler such that the compressed thermal interface pad completes a heat conducting path between the end and the cooler.

Some embodiments of the method further include attaching an air-flow device in the rack, the air-flow device configured to direct a flow of air over the circuit boards and the heat spreader.

Another embodiment is a method swapping out an electronic circuit. The method comprises detaching an installed electronic circuit board from slots of a rack, thereby breaking a connection between a compliant thermal interface pad, and a heat spreader or a cooler inside the rack.

Some embodiments of the method further include replacing the detached electronic circuit board with a different electronic circuit board by applying a force to the different circuit board, such that the compliant thermal interface pad is in-between the heat spreader of the different circuit board and the cooler.

BRIEF DESCRIPTION OF THE DRAWINGS

Various embodiments are best understood from the following detailed description, when read with the accompanying FIGUREs. Some features in the figures may be described as, for example, "top," "bottom," "vertical" or "lateral" for convenience in referring to those features. Such descriptions do not limit the orientation of such features with respect to the natural horizon or gravity. Various features may not be drawn to scale and may be arbitrarily increased or reduced in size for clarity of discussion. Reference is now made to the following descriptions taken in conjunction with the accompanying drawings, in which.

DETAILED DESCRIPTION

The description and drawings merely illustrate the principles of the invention. It will thus be appreciated that those skilled in the art will be able to devise various arrangements that, although not explicitly described or shown herein, embody the principles of the invention and are included within its scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof. Additionally, the term, "or," as used herein, refers to a non-exclusive or, unless otherwise indicated. Also, the various embodiments described herein are not necessarily mutually exclusive, as some embodiments can be combined with one or more other embodiments to form new embodiments.

In shelf configurations, the cooling of higher powered board-level electronic and optical components is becoming increasingly difficult with forced air convection cooling techniques. In addition, constraints on allowable acoustic noise levels often limit practical volumetric air flow rates in convection cooling. Various embodiments implement hybrid cooling of a circuit board in which forced air convective cooling is supplemented via heat spreader(s) and heat conducting path(s) to one or more higher power components on the board. Various embodiments also enable "hot" swapping and/or replacement of said circuit board from a rack, e.g., to allow flexibility in the deployed functionalities on said rack.

Figure 1:
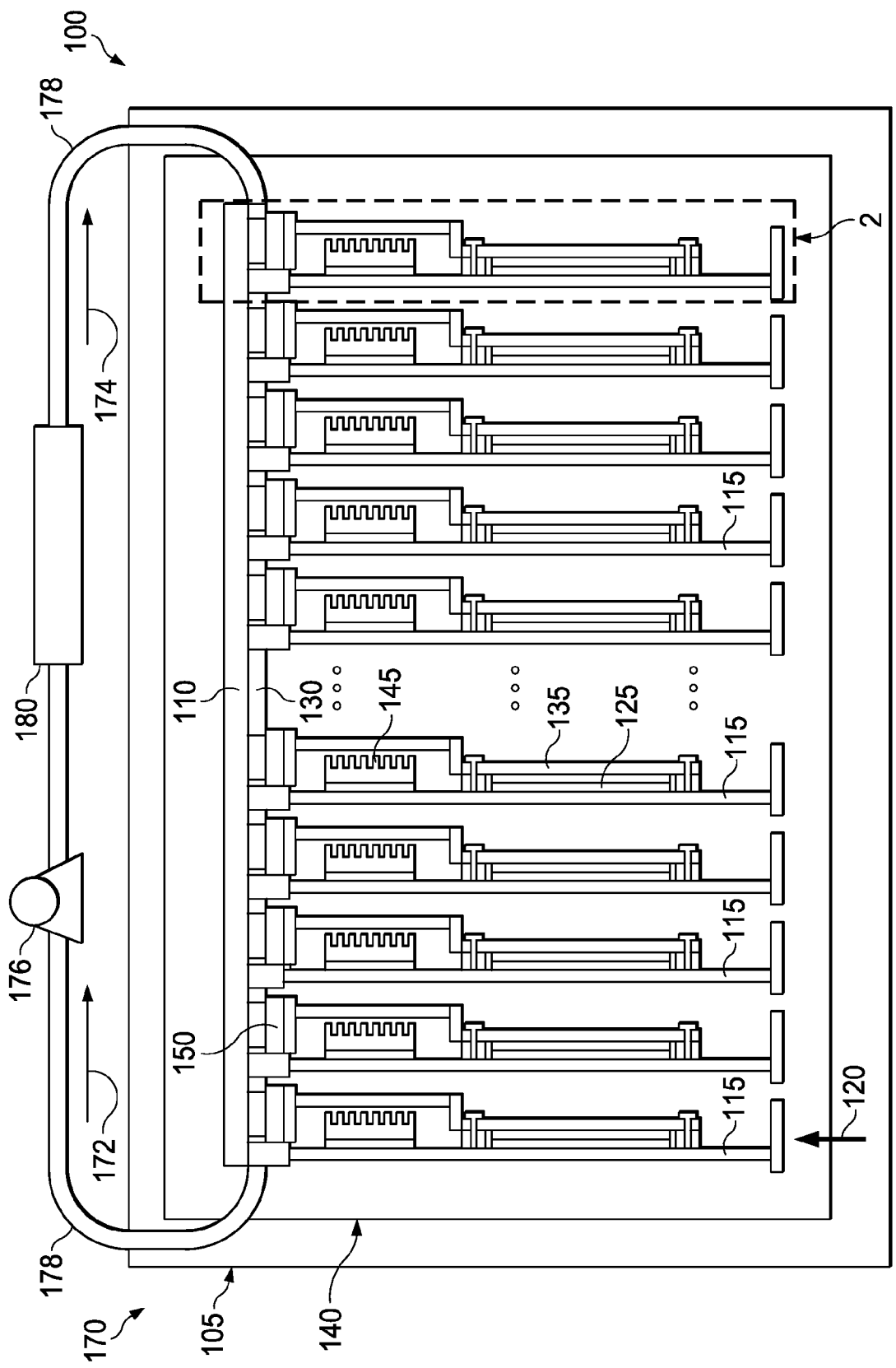
FIG. 1 presents a plan view of an example apparatus of the present disclosure.
Figure 2:
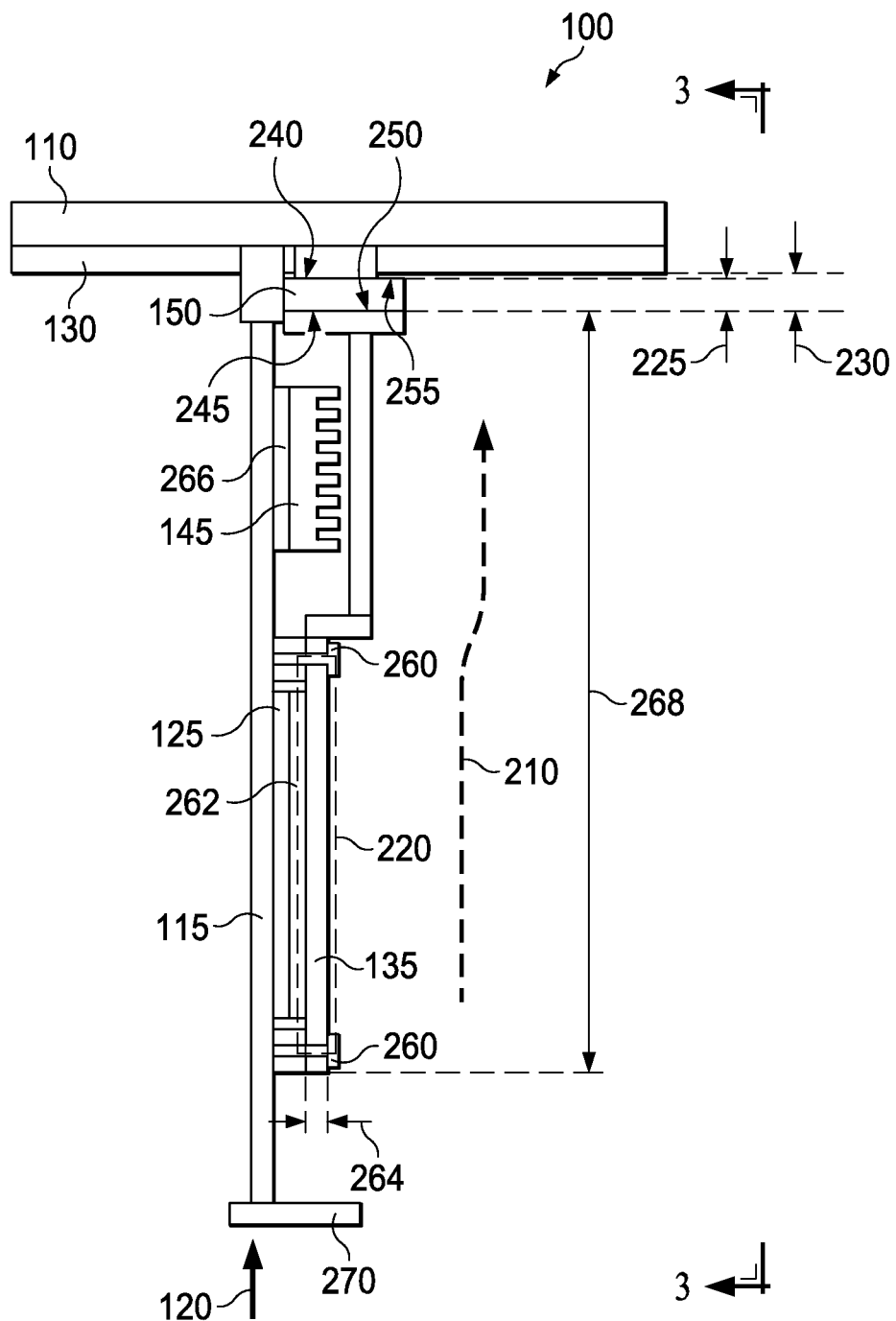
FIG. 2 presents a detailed plan view of portion of the example apparatus shown in FIG. 1 corresponding to view 2 in FIG. 1.
Figure 3:
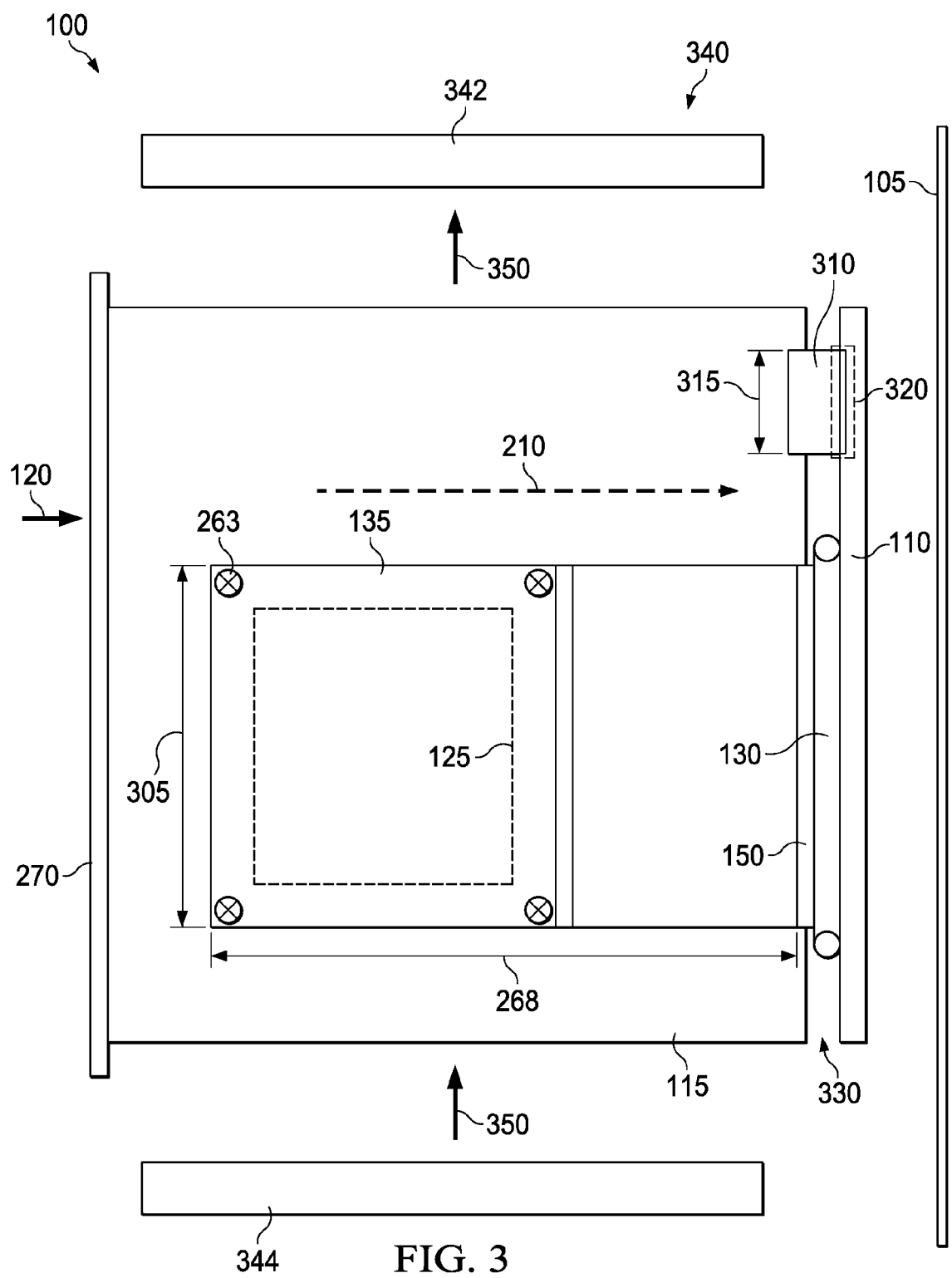
FIG. 3 shows a detailed side view of a portion of the example apparatus along view line 3-3 shown in FIG. 2.

FIG. 1 schematically illustrates an example apparatus 100 of the present disclosure. FIG. 2 presents a detailed plan view of a portion view 2 of the example apparatus 100 of FIG. 1. FIG. 3 shows a detailed side view of a portion of the example apparatus 100 along view line 3-3 of FIG. 2.

Some embodiments of the example apparatus 100 comprises an equipment rack 105 having at least one electronic backplane 110 therein. The rack 105 comprises a plurality of electronic circuit boards 115. Each of the electronic circuit boards 115 are held against the electronic backplane 110 in the rack 105 by an insertion force 120. For example, the insertion force ensures an electrical connection and a direct thermal connection between an individual one of the circuit boards 115 and the electronic backplane 110). Some of the electronic circuit boards 115 have a localized heat source 125 thereon. The apparatus 100 also comprises a common cooler 130 located next to the electronic backplane 110 and a plurality of heat spreaders 135 that connect to corresponding localized heat sources 125 on the circuit boards 115.

In some cases the rack 105 can include one or more shelves 140, each shelf 140 may be configured to hold one of the electronic backplanes 110. Some embodiments of the circuit boards 115 may include other heat spreaders 145 thereon (e.g., heat sinks) which are not physically coupled to the common cooler 130. These other heat spreaders 145 can be configured to cool other components on the circuit board 115 that generate smaller amounts of heat than the localized heat sources 125.

As further illustrated in FIGS. 2 and 3, each heat spreader 135 is configured to form a heat conducting path 210 over and adjacent to one of the electronic circuit boards 115. The heat conducting path goes from a region 220 adjacent to one or more of the localized heat sources 125 to the common cooler 130.

Herein, a heat conducting path is a conduction path that does not include an air air-convection segment whose length is a substantial part of the total physical length of the conduction path. For example, the heat conduction path may not have any air convection segment. Alternately, the heat conduction path may have an air-convection segment whose length is less than 20% of the total length of the conduction path or is less than 10% of the total length of the conduction path.

As illustrated in FIG. 1, the apparatus 100 further comprises one or more compliant thermal interface pads 150. Each compliant thermal interface pad 150 is located in-between one of the heat spreaders 135 and the common cooler 130. Each compliant thermal interface pad 150 is also compressed by a portion of the insertion force 120 to ensure direct physical contact between the thermal interface pad 150 and adjacent portions of both the heat spreader 135 and the common cooler 130.

The characteristics of the compliant thermal interface pad 150 may be selected to increase the conductive heat transfer from the heat spreader 135 to the common cooler 130. For instance, the compliant thermal interface pad's shape, size, including its thickness 225, compressibility, and thermal conductivity properties may be selected to increase such conductive heat transfer. The optimization of selections for said characteristics may depend upon the size of the heat spreader 135, the gap distance 230 between the heat spreader 135 and common cooler 130, the amount of heat produced by the heat source 125, the extent of cooling from the common cooler 130, and/or the extent of cooling from convective air flow in the rack 105.

In some embodiments for conventional circuit boards mounted on shelves in telecom central offices, one or more of the compliant thermal interface pads 150 have a thermal conductivity of at least about 1 W/m-K and in some cases, at least about 2 W/m-K, and in still other cases at least about 5 W/m-K. Such high thermal conductivities facilitate conductive heat transfer through the heat conducting path 210 from the heat source 125 through the pad 150 to the common cooler 130. Non-limiting examples of suitable material for the compliant thermal interface pads 150 includes thermal gap filler such as Tflex™ (MH&W International, Mahwah, N.J.) or GAP PAD® (The Bergquist Company, Chanhassen, Minn.). Based upon the present disclosure, one skilled in the art would understand the other type of materials from which the compliant thermal interface pad 150 could be formed.

In some embodiments, one or more of the compliant thermal interface pads 150 have a degree of compressibility that is able to complete the heat conductive path 210 for a range of different gap distances 230. For instance, in some embodiments, a thickness 225 of at least one of the compliant thermal interface pads 150 is compressible by at least about 10 percent when subjected to the insertion force 120. Variable gap distances 230 between the heat spreader 135 and the common cooler 130 can occur such that different ones of the compliant thermal interface pads 150 have different thicknesses when installed. For instance, there can be variations in the size or placement of the end(s) of the heat spreaders 135 on the circuit board 115, variations in the size of the circuit board 115, variations in the seating of the circuit board 115 in the electronic backplane 110, or variations in the location of the common cooler 130 relative to the circuit board 115.

In some embodiments, one or more of the compliant thermal interface pads 150 is reversibly compressible. For instance, in some cases the compliant thermal interface pad 150 can be an elastic thermal interface pad. For instance, in some embodiments, the pad's thickness 225 can return substantially back to its pre-compression value (e.g., a same thickness 225±1 percent) when the insertion force 120 is not applied to the pad 150. It may also be desirable for such a reversibly compressible pad 150 to be creep resistant such that it will continue to provide the thermal path 210 while tolerating a repeated number of circuit board 115 insertion/removal cycles' (e.g., at least about 10 cycles, and in some cases at least about 100 cycles, in some embodiments) without permanent set or stress relaxation. Such material properties help to preserve the on-going functionality of the apparatus 100 by allowing a "hot" swapping or replacement of any one circuit board 115 from the shelf 140 while other circuit boards 115 of the same shelf 140 remain operational. Such hot swapping or replacing may be performed at various times during the design life of the apparatus 100 or its subcomponents (e.g., during the design lives of the circuit boards 115 on the shelves 140 in the rack 105).

In some embodiments, one or more of the compliant thermal interface pads 150 forms a reversible or removable physical connection between both the heat spreader 135 and the common cooler 130. This can provide the advantage of the ability to easily replace the pad 150 if necessary, e.g., because the pad's 150 useful life has been reached or because a different sized pad 150 is needed to better establish the heat conducive path 210.

However, in some cases, the compliant thermal interface pads 150 can be configured to be physically fixed to the heat spreader 135 or to the common cooler 130, or to both the heat spreader 135 and the common cooler 130. For instance, one or both of the surfaces 240, 245 of the pad 150 can include an adhesive that permanently bonds or fixes the pad 150 to either the heat spreader 135 or the common cooler 130. In some cases, it can be advantageous to physically fix the pad 150 to the common cooler 130 such that, when a circuit board 115 is swapped, the same pad 150, remains attached to the common cooler 130 for use to re-establish the heat conducting path 210 when a new circuit board 115 is swapped in without further manipulation or adjustment of the pad 150. In still other embodiments, the compliant thermal interface pads 150 can be physically fixed to the heat spreader 135 or to the common cooler 130 using mechanical structure(s). For instance, clamp(s), screw(s), frame(s), ledge(s) or similar structures can be used to hold the pad 150 in-place adjacent to the common cooler 130 and/or the adjacent end of one of the heat spreaders 135 when the circuit board 115 is removed from the electronic back plane 110. In still other embodiments, however, the compliant thermal interface pad 150 (e.g., which in some cases can bean elastic thermal interface pad) is configured to be physically held in place in-between one of the heat spreaders 135 and the common cooler 130 by the insertion force 120 alone.

In some embodiments, one or more of the compliant thermal interface pads 150 can have an electrically insulating outer surface. Such an electrically insulated outer surface can help avoid electrical short-circuits when hot-swapping the circuit board 115 with another circuit board 115.

As illustrated in FIGS. 2 and 3, in some embodiments, to facilitate efficient heat transfer, one or more of the elastic thermal interface pads 150 can have a substantially planar surface 240 that is configured to interface with a planar surface 250 of one of the heat spreaders 135 and with a planar surface 255 the common cooler 130. In some embodiments, to facilitate efficient heat transfer through the pad 150, a portion of the heat spreader 135 facing the common cooler 130 is shaped to have a planar rectilinear surface 245 or other planar surface that can be substantially parallel to a planar surface 255 of the common cooler 130 when the circuit board 115 is inserted into the electronic backplane 110. For example, as viewed from a top plan view FIG. 2, the heat spreader 135 can form a T-shaped end having a surface 245 that opposes and is substantially parallel to the planar surface 255 of the common cooler 130. Based on the present disclosure one of ordinary skill would appreciate the end of the heat spreader 135 opposing the common cooler could have other shapes such as L- or U-shapes to provide a surface 245 to facilitate efficient heat transfer to the common cooler 130.

As further illustrated in FIGS. 2 and 3, in some embodiments, the heat spreader 135 can be mechanically attached to one of the localized heat sources 125. For instance, mounting structures 260 such as screws, or spring-loaded screws, or clamps can be used to facilitate mechanical attachment. In some cases, to facilitate heat transfer, there can be a thin layer of thermal interface material 262 between the heat spreader 135 and the localized heat sources 125. In some cases, the attachment to the circuit board 115 can be completed during the circuit board's manufacturing process, prior to the circuit board's placement in the rack 105. In some embodiments, the heat spreader 135 can be permanent attached to the circuit board 115, but in other cases the mechanical attachment can be reversible. For instance it may be desirable to disassemble the heat spreader 135 from the circuit board. 115 in the field using hand tools.

As illustrated in FIG. 2, some embodiments of the heat spreader 135 have thicknesses 264 of less than 2.5 mm. As further illustrated in FIG. 2, some embodiments of the heat spreader 135 can have non-planar geometries, e.g., to facilitate bridging other heat spreaders 145 situated over convection cooled, lower powered or unpowered, devices 266 mounted on the circuit board 115, while not unsuitably reducing the thermal conductivity along the heat transfer path 210.

In some embodiments, the heat spreader 135 can include a nano-heat spreader or a vapor chamber. Some embodiments of the heat spreader 135 can include one or more heat pipes. Some embodiments of the heat spreader 135 can have a thermal conductivity of at least about 2 W/m–K, and in some cases at least about 5 W/m–K. In some cases, a heat spreader 135 having a heat pipe configuration can facilitate forming high aspect ratio form factors (e.g., length 268:thickness 264 or width 305:thickness 264 ratios of greater than 10:1 and in some cases greater than 100:1).

In some embodiments of the apparatus 100, the insertion force 120 is created by a spring-loaded or leaver-actuated latch applied to a faceplate 270 of each of the electronic circuit boards 115. The insertion force 120 provides the necessary pressure to form the thermally conductive path 210, through the pad 150, between the heat spreader 135 and the common cooler 130.

As illustrated in FIG. 3, in some embodiments of the apparatus 100, the electronic circuit boards 115 have a single slot 310 of less than about 25 mm in width 315 that is configured to fit into a receptacle 320 of the electronic backplane 110. In some such embodiments, the localized heat source 125 (or sources in some cases) can be high-powered optical or electrical component (or components), and consequently generate, large amounts of heat compared to amounts of heat generated by other discrete components on the same circuit board 115. For example, in some cases, the localized heat sources 125 can use at least about 10 Watts of power, and in some cases at least about 50 Watts of power, and in still other cases at least about 100 Watts of power. Examples of such high-powered localized heat sources 125 may include an optical differential phase-shift keying demodulator or a laser source.

In contrast to solely forced air convection cooling techniques, the cooling structures disclosed herein can adequately remove heat for localize high-dissipation optical or electrical components, i.e., local heat sources 125. In addition, the optical or electrical component local heat sources 125 may have large lateral areas on a circuit board 115 that has a single slot 310 width of less than or equal to the 25 mm of conventional slots for individual circuit boards in telecom central offices. Because of maximum allowable acoustic noise levels, it might be necessary to substantially increase (e.g., double in some cases) the space for individual circuit board 115 in the shelf 140 to provide adequate cooling in the absence of hybrid techniques described herein. Thus, the embodiments based on hybrid cooling can enable the use of narrow slots for individual circuit boards 115 than in systems whose cooling is based only on convective air cooling.

The cooling structures disclosed herein are also in contrast to directly mounting cooling loop evaporators to high-powered optical or electrical component local heat sources 125. Again consider the example of optical or electrical component local heat sources 125 on a circuit board 115 having a single slot 310 with a conventional width of less than or equal to 25 mm. To achieve cooling using directly mounted cooling loop evaporators, it may be necessary to provide an additional slot volume (e.g., a larger slot width 315) and/or additional slots, to accommodate the directly mounted evaporators. Such a solution is often not desirable because the self's useful through-put capacity (typically measured as bits of data switched or processed per volume of equipment) is often roughly inversely related to the slot width, i.e., is roughly directly related to the number or slots thereon. For instance, the through-put capacity may be reduced by half by a doubling of the slot width 315 of the shelf 140 from 25 mm to 50 mm. Additionally, in some cases, directly mounting such cooling loop evaporators to the local heat sources 125 can result in the loss of the ability to easily "hot" swap or replace circuit boards 115, without typically a long duration physical de-installation procedures.

In contrast, in certain embodiments, each of the circuit boards 115 is configured to be reversibly or removably held in the corresponding slot against to the electronic backplane 110, and in some cases, any one of the circuit boards 115 can be removed from the electronic backplane 110 without interrupting electrical power provided to the other ones of the plurality of circuit boards 115. Additionally, in some embodiments of the apparatus 100, the one or more circuit boards 115 can each have multiple slots 310, or, have a single slot 310 with a width 315 of about 25 mm or more, if desired.

Returning to FIG. 1, in some embodiments of the apparatus 100, the common cooler 130 can be configured to circulate a refrigerant. For instance, in some cases the common cooler 130 can be configured as an evaporator (e.g., a microchannel evaporator in some cases) having a two-phase cooling loop. In other embodiments, however, the common cooler 130 can be configured a solid structure having a high thermal conductivity (e.g., a metal bar).

As illustrated in FIG. 3 in some embodiments of the apparatus 100, portions of the common cooler 130 are positioned in a space 330 between the circuit boards 115 and the electronic backplane 110. Such a positioning of said portions of the common cooler 130 can facilitate efficient thermal coupling of each of the heat spreaders 135 to the common cooler 130 as well as reducing the amount of space occupied within the rack 105 by the common cooler 130.

In some cases, the common cooler 130 can be part of a cooling system 170 that further includes supply and return lines 172, 174, a pumping mechanism 176 for circulating the liquid and/or vapor phases of a refrigerant 178 through the closed loop, and a condenser sub-unit 180. In some cases, the supply and return lines 172, 174 can be flexible lines and use a "quick-disconnect" end fitting that allows the on-site installation of the common cooler 130 as well as the modular serial or parallel connection of multiple common coolers 130 to a single condenser sub-unit 180. For instance, in some cases, each common cooler 130 can be located on a corresponding shelf 140 of the rack 105 and/or can be associated with a different electronic back plane 110. In some cases, the condenser sub-unit 180 can be located remotely from the rack 105. In some cases, the condenser sub-unit 180 can be configured to interface with the building chilled water supply. However, in other cases, the condenser sub-unit 180 can be configured to interface with other heat dissipating mechanisms, such as a separate air-conditioning AC cooling loop, heat sinks or the ambient room air.

In some embodiments the common cooler 130 is configured to circulate a refrigerant 178 that is a gas at an ambient temperature and pressure (e.g., about 20° C. and about 1 atmosphere pressure). For such embodiments, in the event of a refrigerant 178 leak, no liquid phase refrigerant would be present in the equipment space, thereby reducing the possibility of damage to circuit boards 115 and their component parts component or board module damage. Similarly, some embodiments use examples of the refrigerant 178 that are organic dielectrics, to reduce the possibility of damage to circuit boards 115 and their component parts, e.g., in the event of leakage from the common cooler 130. Non-limiting examples of suitable refrigerants include 1,1,1,2-tetrafluoroethane, also known as R134a or HFC-134a, or similar haloalkane refrigerants, or other refrigerants familiar to those of ordinary skill in the art.

Based on the present disclosure one of ordinary skill in the art would understand how heat could be transferred from the localized heat source 125, to the common cooler 130 where the refrigerant is vaporized, to facilitate higher heat transfer rates by exploiting the latent heat of vaporization of the refrigerant 178. The vapor phase of the refrigerant 178 is moved by the pumping mechanism 176 to the condenser 180 where heat transfer occurs, thereby condensing the refrigerant 178 back to a liquid. The condensed liquid refrigerant 178 is returned to the common cooler 130 where the cycle continues, thus completing a closed cooling loop.

Some embodiments of the present disclosure provide a hybrid cooling solution that uses both conductive cooling at the level of individual electronic circuit boards 115, as described herein, and convective air flow cooling. For instance, as further illustrated in FIG. 3, some embodiments of the apparatus 100 further include an air-flow device 340 located in the rack 105 and configured to remove heat from the circuit boards 115. In some embodiments, the air-flow device 340 includes one or more fan trays 342, 344 located inside of the rack 105. The air flow heat exchange device 340 can be configured to deliver an air flow in an average direction 350 that is parallel to the major surface of the electronic circuit boards 115. For instance, in some cases, the air flow direction 350 can be the from bottom to top of the rack 105 and provided by an array of air movers (e.g., axial fans) housed in the one or more fan trays 342, 344 that are positioned either above and/or below a shelf 140. In some cases, because of the cooling efficiencies gained from conductive cooling, there can be a reduced input power for air-flow device 340, e.g., due to reduced fan speeds. For example, in some cases the airflow in cubic feet per minute for the air-flow device 340 can be reduce by 20-50 percent with proportional reductions in power consumption, as compared to cooling without conductive cooling as described herein.

Figure 4:
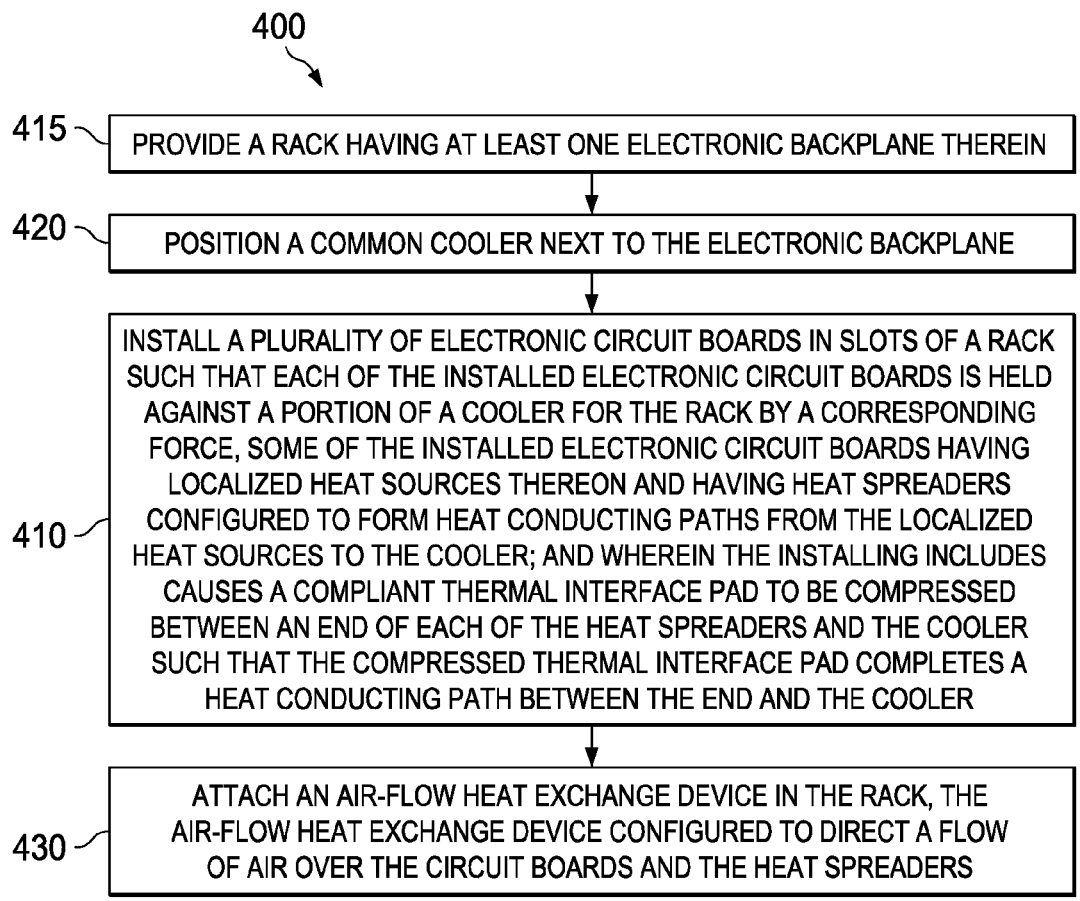
FIG. 4 presents a flow diagram illustrating an example method for assembling an apparatus of the disclosure such as the any of the embodiments of the example apparatuses discussed in the context of FIGS. 1-3.

Another embodiment is a method of assembling an apparatus. FIG. 4 presents a flow diagram illustrating an example method 400 for assembling an apparatus of the disclosure. Any of the embodiments of the apparatus 100, and its component parts such as described in the context of FIGS. 1-3, can be assembled in accordance with the method 400.

With continuing reference to FIGS. 1-3 throughout, the method 400 comprises a step 410 of installing a plurality of electronic circuit boards 115 in slots 310 of a rack 105 such that each of the installed electronic circuit boards 115 is held against a portion of a cooler 130 for the rack 105 by a corresponding force 120, some of the installed electronic circuit boards 115 having localized heat sources 125 thereon and having heat spreaders 135 configured to form heat conducting paths 210 from the localized heat sources 125 to the cooler 130.

Some embodiments of the method 400 further include a step 415 of providing the rack 105 having at least one electronic backplane 110 therein, and, a step 420 of positioning a cooler 130 (e.g., a common cooler) next to the electronic backplane 110. In some cases, each heat spreader 135 is configured to form a heat conducting path 210 over and adjacent to one of the electronic circuit boards 115 from a region adjacent to one or more of the localized heat sources 125 thereon to the cooler 130.

Some embodiments of the method 400 further include a step 430 of attaching an air-flow device 340 in the rack 105, the air-flow device 340 configured to direct a flow of air 350 over the circuit boards 115 and the heat spreaders 135 or other heat spreaders 257. For instance, attaching an air-flow device 340 in step 440 can include attached one or more fan trays 342, 344 configured to force air over the circuit board 115. For instance fan trays 342, 344 can be located above and below the row of circuit boards 115 and configured to push or pull air over the surfaces of the circuit boards 115 at the same time that the heat is being transferred from one or more of the circuit boards 115 to the common cooler 130. As noted above, the additional cooling provided by transfer conductive heat transfer through the heat spreaders 135 to the common cooler 130, in turn, may permit the air-flow device 340 to be operated at lower speeds resulting in less acoustic noise and/or power consumption associated with cooling the structures in the rack 105.

Figure 5:
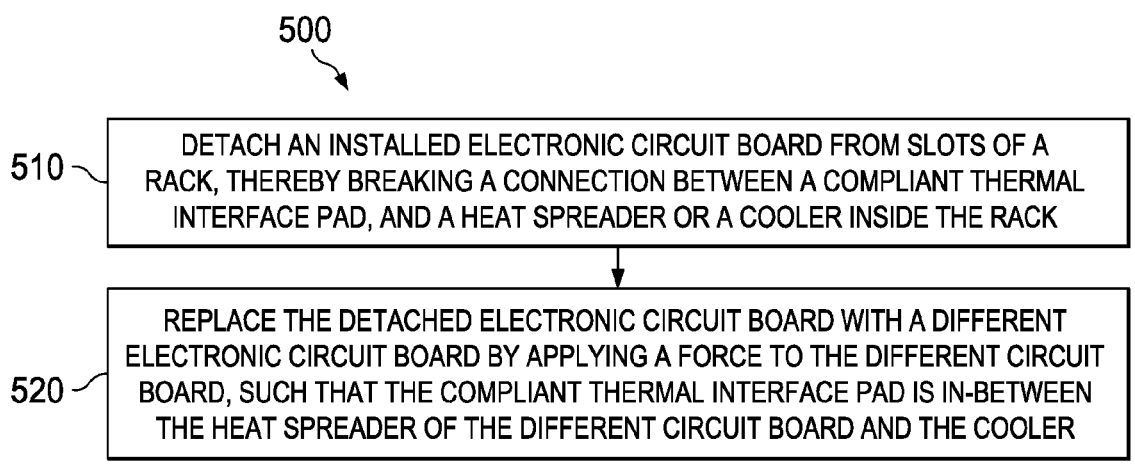
FIG. 5 presents a flow diagram illustrating an example method for swapping out an electronic circuit of the disclosure such as the any of the an electronic circuit embodiments of the example apparatuses discussed in the context of FIGS. 1-3.

Another embodiment is a method of swapping out an electronic circuit. FIG. 5 presents a flow diagram illustrating an example method 500 for swapping out an electronic circuit. The method 500 can be applied to any of the embodiments of the apparatus 100, and its component parts such as described in the context of FIGS. 1-3.

With continuing reference to FIGS. 1-3 throughout, the method 500 comprises a step 510 of detaching an installed electronic circuit board 115 from slots 310 of a rack 105, thereby breaking a connection between a compliant thermal interface pad 150, and a heat spreader 135 or a cooler 130 (e.g., a common cooler) inside the rack 105.

Some embodiments of the method 500 further include a step 520 of replacing the detached electronic circuit board 115 with a different electronic circuit board 115 by applying a force to the different circuit board 115, such that the compliant thermal interface pad 150 is in-between the heat spreader 135 of the different circuit board 115 and the cooler 130.

Although various embodiments of the present invention has been described in detail, those skilled in the art should understand that they can make various changes, substitutions and alterations herein without departing from the scope of the claimed inventions.

What is claimed is:

1. An apparatus, comprising:
   a rack;
   a cooler;
   a plurality of electronic circuit boards located in corresponding slots of the rack, each of the electronic circuit boards being held against a portion of the cooler by a corresponding force, some of the electronic circuit boards having a localized heat source thereon;
   a plurality of heat spreaders, each heat spreader configured to form a heat conducting path over and adjacent to one of the electronic circuit boards from one or more of the localized heat sources thereon to the portion of the cooler; and
   a plurality of compliant thermal interface pads, each of the pads being compressed between an end of one of the heat spreaders and the portion of the cooler to form a heat conduction path therebetween.

2. The apparatus of claim 1, wherein one or more of the compliant thermal interface pads has a thermal conductivity of at least 1 W/m–K.

3. The apparatus of claim 1, wherein at least one of the compliant thermal interface pads is an elastic thermal interface pad.

4. The apparatus of claim 3, wherein a thickness of the elastic thermal interface pad is compressible by at least 10 percent when subjected to the force on the corresponding one of the boards and the thickness returns substantially back to its pre-compression value when the force on the corresponding one of the boards is not applied to the elastic thermal interface pad.

5. The apparatus of claim 1, wherein one or more of the compliant thermal interface pads are configured to be fixed to one or both of the heat spreader or the common cooler.

6. The apparatus of claim 1, wherein one or more of the compliant thermal interface pads have an electrically insulating outer surface.

7. The apparatus of claim 1, wherein one or more of the compliant thermal interface pads have a substantially planar surface that is configured to interface with a planer surface of the heat spreader and with a planar surface of the common cooler.

8. The apparatus of claim 1, wherein each force is created by a spring-loaded or leaver-actuated latch applied to a faceplate of the corresponding one of the electronic circuit boards.

9. The apparatus of claim 1, wherein the electronic circuit boards fit into single slot of less than about 25 mm in width.

10. The apparatus of claim 1, wherein some of the circuit boards swappable out of the rack without interrupting electrical power provided to the other ones of the plurality of circuit boards.

11. The apparatus of claim 1, the heat spreader is mechanically attached to one of the localized heat sources.

12. The apparatus of claim 1, wherein a portion of the heat spreader facing the portion of the cooler is a planar surface that is parallel to a planar surface of the portion of the cooler.

13. The apparatus of claim 1, wherein the cooler is configured as an evaporator having a two-phase cooling loop.

14. The apparatus of claim 1, wherein the portion of the cooler is positioned in a space between the circuit boards and an electronic backplane of the rack.

15. The apparatus of claim 1, wherein the cooler is configured to circulate a refrigerant that is a gas at an ambient temperature and pressure.

16. The apparatus of claim 1, further including an air-flow device located in the rack and configured to remove heat from the circuit boards.

17. A method of assembling an apparatus, comprising:
installing a plurality of electronic circuit boards in slots of a rack such that each of the installed electronic circuit boards is held against a portion of a cooler for the rack by a corresponding force, some of the installed electronic circuit boards having localized heat sources thereon and having heat spreaders configured to form heat conducting paths from the localized heat sources to the cooler; and wherein the installing causes a compliant thermal interface pad to be compressed between an end of each of the heat spreaders and the cooler such that the compressed thermal interface pad completes a heat conducting path between the end and the cooler.

18. The method of claim 17, further including:
attaching an air-flow device in the rack, the air-flow device configured to direct a flow of air over the circuit boards and the heat spreader.

19. The method method of claim 17, further including: swapping out an electronic circuit, comprising:
detaching an installed electronic circuit board from slots of a rack, thereby breaking a connection between a compliant thermal interface pad, and a heat spreader or a cooler inside the rack.

20. The method of claim 19, further including:
replacing the detached electronic circuit board with a different electronic circuit board by applying a force to the different circuit board, such that the compliant thermal interface pad is in-between the heat spreader of the different circuit board and the cooler.

* * * * *